United States Patent
Gu et al.

(10) Patent No.: US 9,499,393 B2
(45) Date of Patent: Nov. 22, 2016

(54) STRESS RELIEF MEMS STRUCTURE AND PACKAGE

(71) Applicant: MKS Instruments, Inc., Andover, MA (US)

(72) Inventors: Lei Gu, Lexington, MA (US); Stephen F. Bart, Newton, MA (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 14/616,017

(22) Filed: Feb. 6, 2015

(65) Prior Publication Data

US 2016/0229688 A1  Aug. 11, 2016

(51) Int. Cl.
| H01L 27/14 | (2006.01) |
| B81B 7/00 | (2006.01) |
| B81C 1/00 | (2006.01) |

(52) U.S. Cl.
CPC ......... B81B 7/0048 (2013.01); B81C 1/00547 (2013.01)

(58) Field of Classification Search
CPC . B81B 7/0048; B81C 1/00547; H01L 23/13; H01L 41/33
USPC ........................................................ 257/414
See application file for complete search history.

(56) References Cited

U.S. PATENT DOCUMENTS

| 4,680,569 | A | 7/1987 | Yamaki et al. |
| 7,389,697 | B2 | 6/2008 | Jonsson et al. |
| 7,703,329 | B2 | 4/2010 | Sekine et al. |
| 7,798,010 | B2 | 9/2010 | Morales et al. |
| 8,212,346 | B2 | 7/2012 | Ryan et al. |
| 2003/0230792 | A1 | 12/2003 | Wu et al. |
| 2005/0266613 | A1 | 12/2005 | Agraharam et al. |
| 2011/0230068 | A1 | 9/2011 | Pahl |
| 2013/0319117 | A1 | 12/2013 | McNeil et al. |
| 2014/0150559 | A1 | 6/2014 | Ishihara et al. |
| 2014/0238131 | A1* | 8/2014 | Yoshiuchi .......... G01C 19/5769 73/514.16 |
| 2015/0040674 | A1 | 2/2015 | Ishihara et al. |
| 2015/0090041 | A1* | 4/2015 | Imai ...................... G01L 19/146 73/723 |

FOREIGN PATENT DOCUMENTS

| EP | 2921837 | 9/2015 |
| JP | 2002134439 | 5/2002 |
| WO | 92/06495 A1 | 4/1992 |

OTHER PUBLICATIONS

Lippert, T. et al. Laser Processing of Soft Materials. Romanian Reports in Physics, 59(2): 483-498 (2007).

(Continued)

*Primary Examiner* — Tu-Tu Ho
(74) *Attorney, Agent, or Firm* — Burns & Levinson, LLP; Joseph M. Maraia; Steven M. Mills

(57) ABSTRACT

Stress relief structures and methods that can be applied to MEMS sensors requiring a hermetic seal and that can be simply manufactured are disclosed. The system includes a sensor having a first surface and a second surface, the second surface being disposed away from the first surface, the second surface also being disposed away from a package surface and located between the first surface and the package surface, a number of support members, each support member extending from the second surface to the package surface, the support members being disposed on and operatively connected to only a portion of the second surface. The support member are configured to reduce stress produced by package-sensor interaction.

20 Claims, 9 Drawing Sheets

(56) References Cited

OTHER PUBLICATIONS

Michel, M. et al. Deposition Mechanisms in Layer-by-Layer or Step-by-Step Depositions Methods: From Elastic and Impermeable Films to Soft Membranes with Ion Exchange Properties. ISRN Materials Science, vol. 2012, Article ID 701695, 13 pages.

International Search Report and Written Opinion dated Apr. 8, 2016 in corresponding PCT Application No. PCT/US2016/013613 filed Jan. 15, 2016.

* cited by examiner

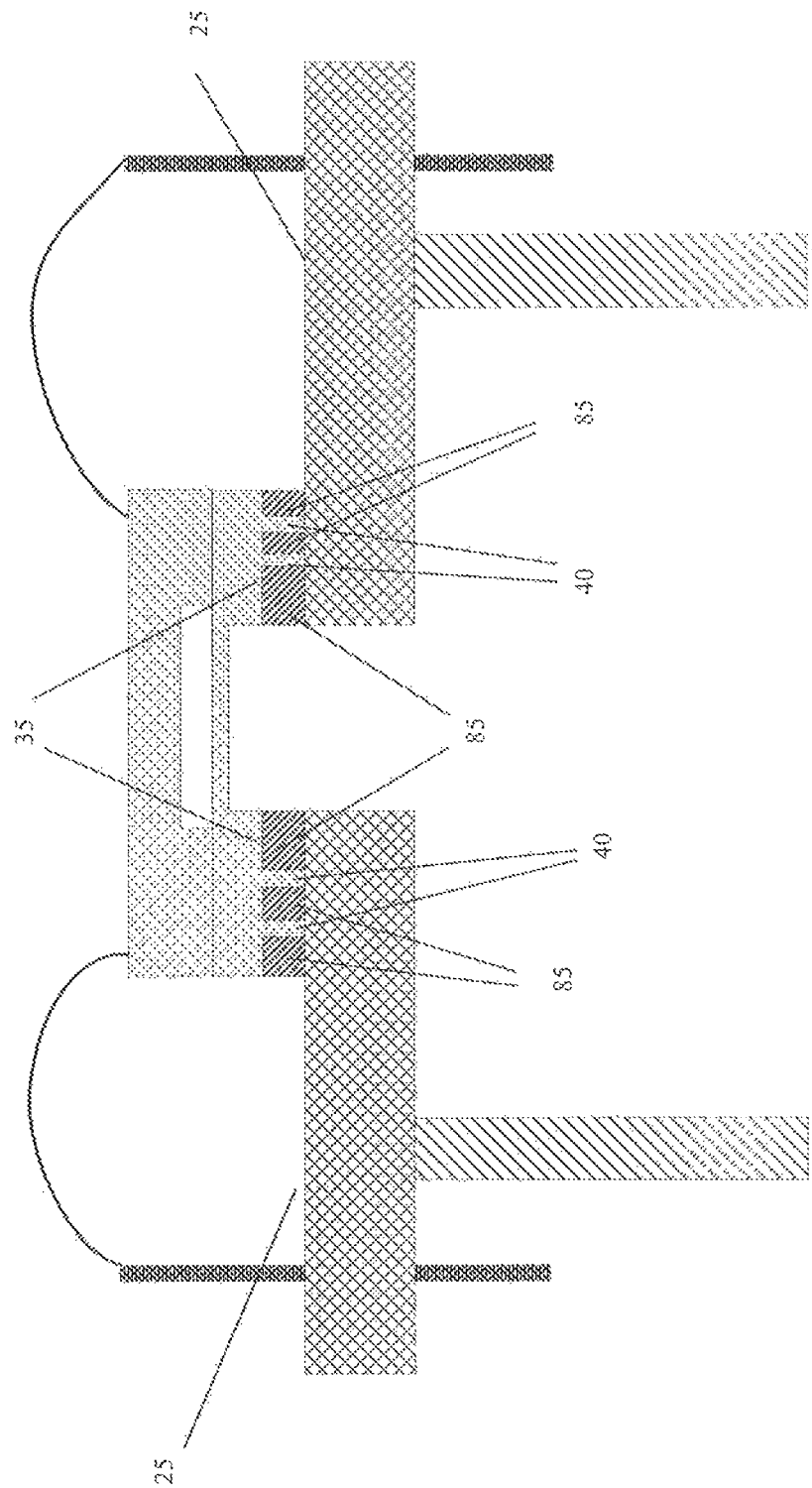

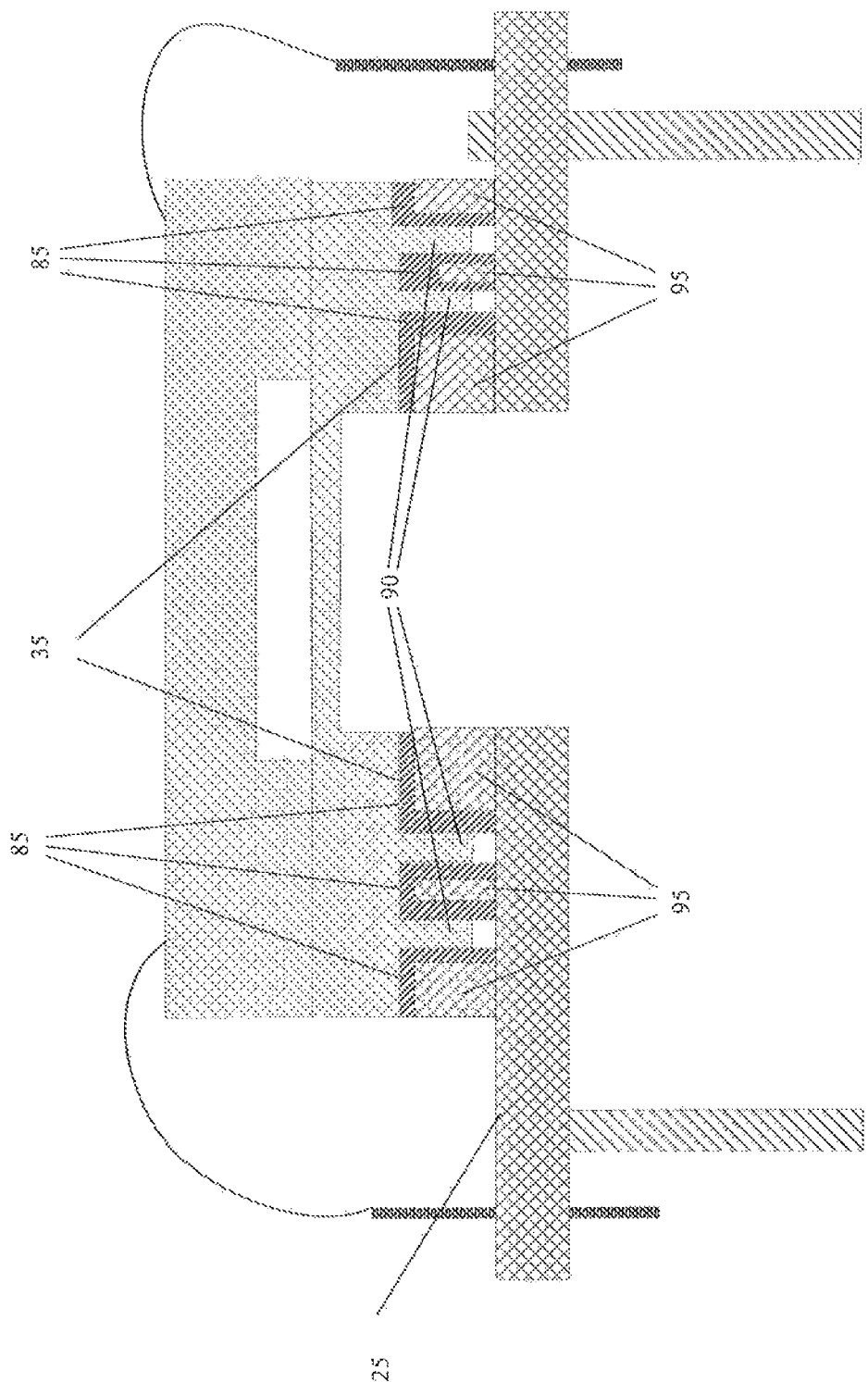

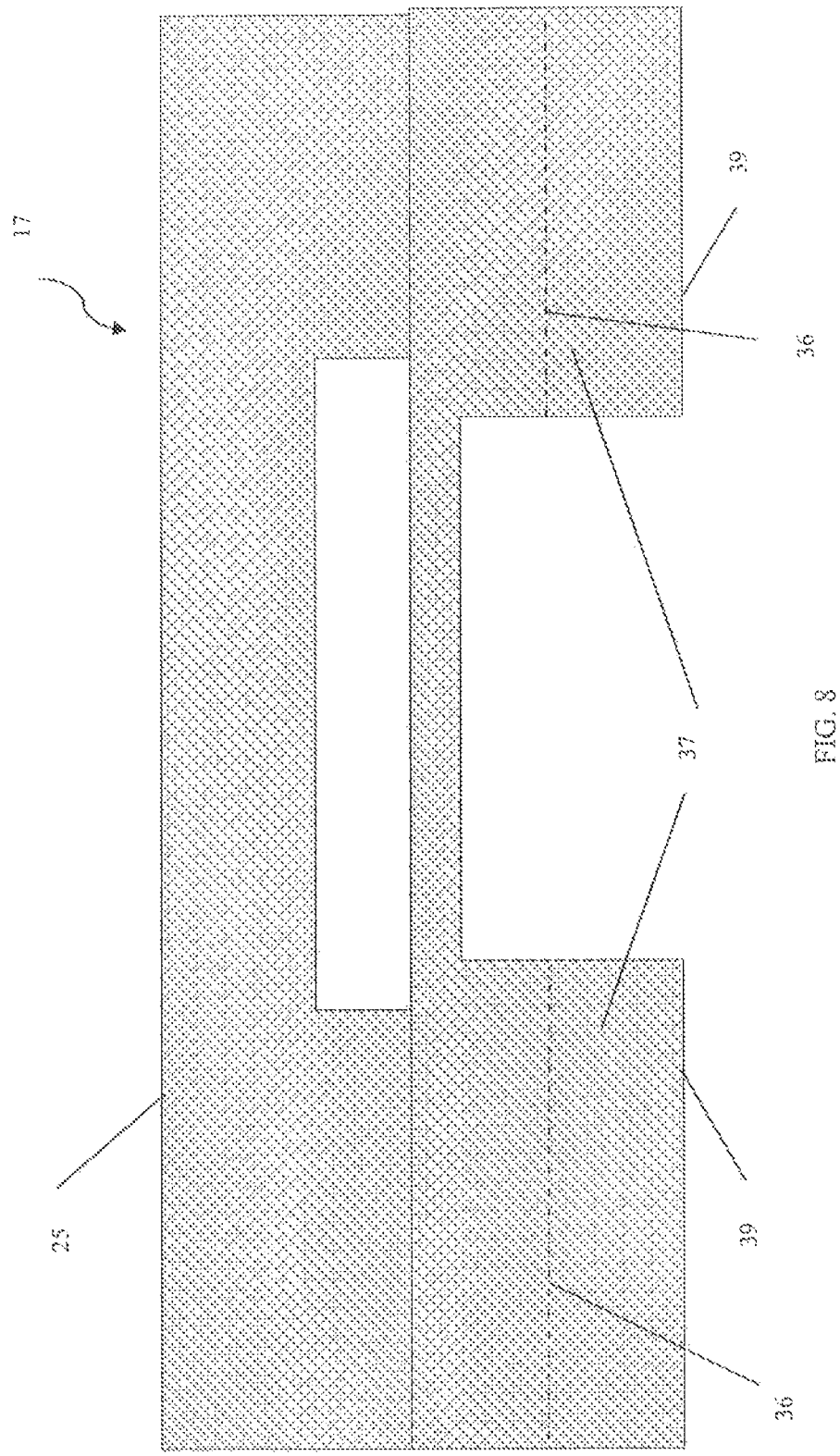

STRESS RELIEF MEMS STRUCTURE AND PACKAGE

FIELD OF THE INVENTION

This invention relates generally to MEMS sensors, and, more particularly, to structures for stress relief in MEMS sensors.

BACKGROUND

Micro-Electrical-Mechanical-Systems (MEMS) such as sensors can be widely used in applications such as automotive, household appliance, building ventilation, and in general industrial applications to sense a physical condition such as pressure, temperature, or acceleration, and to provide an electrical signal representative of the sensed physical condition.

Most sensors are sensitive to stress or strain of their physical structure in addition to being sensitive to the measurand of interest. Such stresses can be internally generated by virtue of the sensor structure itself, or can be externally generated by the sensor's enclosure, or packaging. Package stresses, such as thermal stress, can affect the output of a MEMS sensor. One example of package-sensor interaction stresses are stresses caused by the mismatch in the thermal expansion coefficient of components of the package and components of the sensor. Different methods for providing thermal stress relief from packages have been previously disclosed. Some of the conventional methods use flexible support beams to suspend the sensor element. All other conventional methods apply package bonding modification, e.g. by using flexible support diaphragm, flexible support chuck, or putting stress buffer material between the MEMS device and the package.

The conventional methods are not suitable for some MEMS pressure sensor packages. For example, the use of flexible support beams requires extra stress relief support structure, which is not hermetic and cannot withstand high applied pressure. Other conventional methods require extra parts or result in a high cost due to complex manufacturing requirements.

There is a need for stress relief structures and methods that can be applied to MEMS sensors requiring a hermetic seal and that can be simply manufactured.

BRIEF SUMMARY

Stress relief structures and methods that can be applied to MEMS sensors, including MEMS sensors that require a hermetic seal, and that can be simply manufactured are disclosed herein below.

In one or more embodiments, the system of these teachings includes a sensor having a first surface and a second surface, the second surface being disposed away from the first surface, the second surface also being disposed away from a package surface and located between the first surface and the package surface. The system also includes one or more support members, each support member extending from the second surface to the package surface. The support members are disposed on and operatively connected to only a portion of the second surface. The one or more support members are configured to reduce stress produced by package-sensor interaction.

In further embodiments of the system of these teachings, a first support member from the one or more support members surrounds a central region of the second surface, and a second support member from the one or more support members surrounds the first support member. Each support member from the one or more support members comprises a closed structure and/or a hollow cylindrical structure, wherein the closed curves in the cylindrical structure are not circles. Each one of the closed curves comprises a plurality of sections, each section from the plurality of sections being joined to another section from the plurality of sections at one or more points, a slope of each section not being equal to a slope of another section at at least one of the one or more points.

In yet further embodiments of the system of these teachings, each support member from the one or more support members is comprised of the same material as a section of the sensor proximate to the second surface and/or the same material as the package surface. The one or more support members comprise one or more first support members extending away from the second surface and one or more second support members extending from the package surface to the second surface, the one or more second support members configured to receive the one or more first support members. Each support member from the one or more first support members extends a distance away from the second surface, where the distance is smaller than a distance between the second surface and the package surface. In one instance, each support member from the one or more support members has a cross-sectional area that varies with distance away from the second surface. In one embodiment, the cross-sectional area decreases with distance away from the second surface. In another embodiment, the cross-sectional area increases with distance away from the second surface. In yet other embodiments, each support member from the one or more support members comprises two subcomponents: a first subcomponent extending from the second surface to a predetermined location between the second surface and the package surface and a second subcomponent extending from the predetermined location to the package surface. In one instance, a cross-sectional area of the first subcomponent is larger than a cross-sectional area of the second subcomponent. In another instance, a cross-sectional area of the first subcomponent is smaller than a cross-sectional area of the second subcomponent.

In still further embodiments of the system of these teachings, the system further comprises a soft material disposed between the second surface, the package surface and the one or more support members. The system further comprises a soft material disposed between the second surface, the package surface and the one or more second support members. The system further comprises a soft material disposed between the second surface, the package surface and the one or more first and one or more second support members. The one or more support members comprise at least two support members. A width of one support member is smaller than a width of other support members. A sealing material is applied between the package surface and at least one support member, the sealing material being configured to provide a hermetic seal. At least one support member is bonded to the package surface.

In one or more embodiments, the method of these teachings for fabricating a sensor system having reduced stress due to package-sensor interaction includes etching into a surface of a component of a sensor structure, the sensor structure having a first surface, in order to form a second surface of the sensor structure and one or more support structures disposed on the second surface. The second surface is disposed away from the first surface. The second surface is also disposed away from a package surface and located between the first surface and the package surface. The one or more support structures are configured to reduce stress produced by package-sensor interaction.

In yet further embodiments of the method of these teachings, the one or more support structures are configured such that, in the sensor system, each support structure from the one or more support structures extends from the second surface to the package surface. The component is a silicon component. A first support member from the one or more support structures surrounds a central region of the second surface and each subsequent support structure surrounds prior support structures. Each support structure from the one or more support structures comprises a closed structure and/or a hollow cylindrical structure, wherein the closed curves in the cylindrical structure are not circles. Each one of the closed curves comprises a plurality of sections, each section from the plurality of sections being joined to another section from the plurality of sections at one or more points, a slope of each section not being equal to a slope of another section at at least one of the one or more points. Each support member from the one or more support structures extends a distance away from the second surface, the distance being smaller than a distance between the second surface and the package surface.

In yet further embodiments of the method of these teachings, the method further comprises trimming each support structure such that each support structure from the one or more support structures has a cross-sectional area that varies with distance away from the second surface, the cross-sectional area increasing with distance away from the second surface. In still another embodiment, the method further comprises trimming each support structure such that each support structure from the one or more support structures has a cross-sectional area that varies with distance away from the second surface; the cross-sectional area decreasing with distance away from the second surface. In yet another embodiment, the method further comprises trimming each support structure such that each support structure from the one or more support structures comprises two subcomponents, a first subcomponent extending from the second surface to a predetermined location between the second surface and the package surface and a second subcomponent extending from the predetermined location to the package surface, a cross-sectional area of the first subcomponent being smaller than a cross-sectional area of the second subcomponent.

A number of other embodiments of the system and method of these teachings are also disclosed.

For a better understanding of the present teachings, together with other and further objects thereof, reference is made to the accompanying drawings and detailed description and its scope will be pointed out in the appended claims.

BRIEF DESCRIPTION OF THE DRAWINGS

FIG. 4 is a cross-sectional view of another embodiment of the stress relief structure of these teachings;

FIG. 5 shows a cross-sectional view of yet another embodiment of the stress relief structure of these teachings;

FIG. 8 shows an exemplary embodiment of a sensor structure used in fabricating the system of these teachings.

DETAILED DESCRIPTION

Stress relief structures and methods are disclosed herein below. The stress relief structures and methods of these teachings can be applied to MEMS sensors and result in systems that can be simply manufactured.

The description is not to be taken in a limiting sense, but is made merely for the purpose of illustrating the general principles of these teachings, since the scope of these teachings is best defined by the appended claims. Although the teachings have been described with respect to various embodiments, it should be realized these teachings are also capable of a wide variety of further and other embodiments within the spirit and scope of the appended claims.

As used herein, the singular forms "a," "an," and "the" include the plural reference unless the context clearly dictates otherwise.

"Package-sensor interaction," as used herein, refers to stresses generated by interaction between the sensor and the packaging. One example, these teachings not being limited to only that example, of package-sensor interaction stresses are stresses caused by the mismatch in the thermal expansion coefficient of components of the package and components of the sensor.

Figure 1:
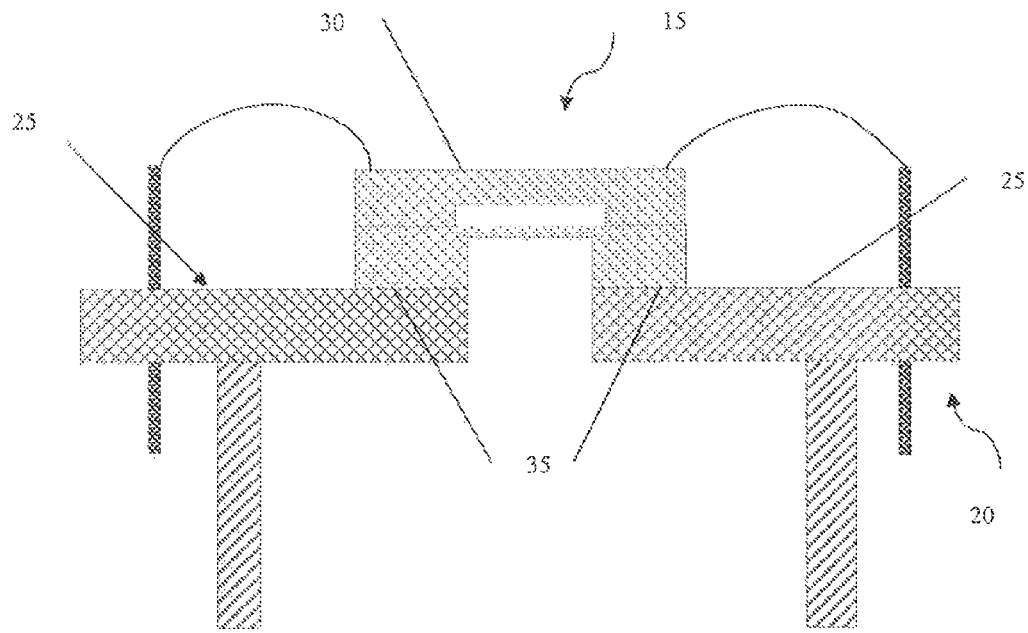
FIG. 1 is a cross-sectional view of a conventional mounting of a sensor on a package component.

FIG. 1 shows a cross-sectional view of a conventional mounting of a sensor on a package component. Referring to FIG. 1, a pressure sensor 15 is disposed on the package component 20. The pressure sensor 15 has a first surface 30 and a second surface 35. The second surface 35 is mounted directly on a surface 25 of the package component 20.

In the case of a MEMS, ceramic, or other non-metallic sensor, the sensor is generally bonded to a metallic package with solder, brazing, welding, or epoxy type adhesives. Typically, the entire mating surface of the sensor is bonded in order to get the strongest, most hermetic seal, or simply for manufacturing simplicity.

In one or more embodiments, the system of these teachings includes a sensor having a first surface and a second surface, the second surface being disposed away from the first surface, the second surface also being disposed away from a package surface and located between the first surface and the package surface, a number of support members, each support member extending from the second surface to the package surface, the support members being disposed on and operatively connected to only a portion of the second surface. The support members are configured to reduce stress produced by package-sensor interaction such as, but not limited to, package-sensor thermal interaction.

Figure 2:
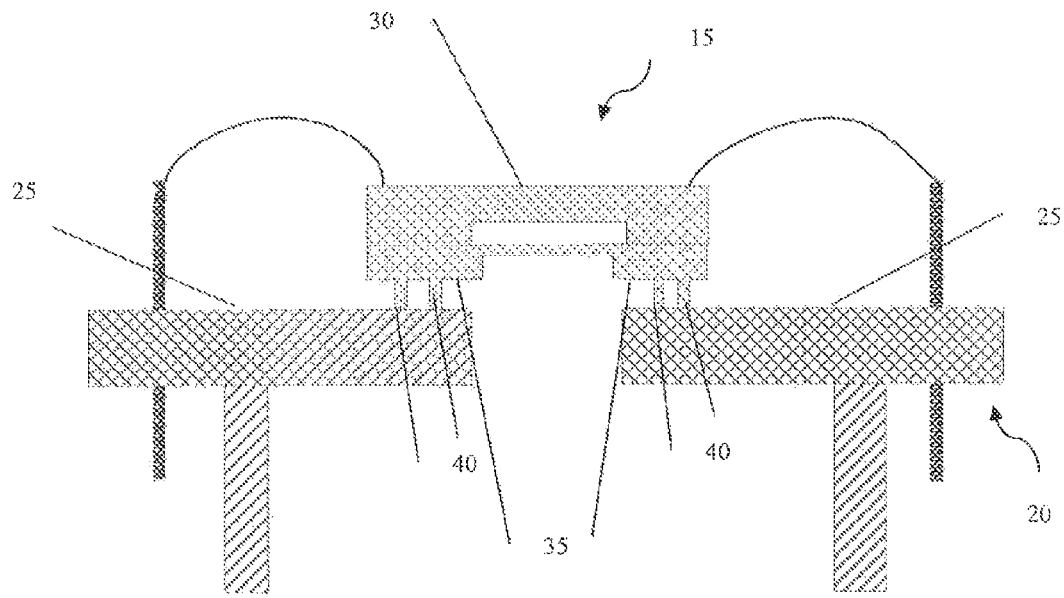
FIG. 2 is a cross-sectional view of one embodiment of the system of these teachings.
Figure 3A:
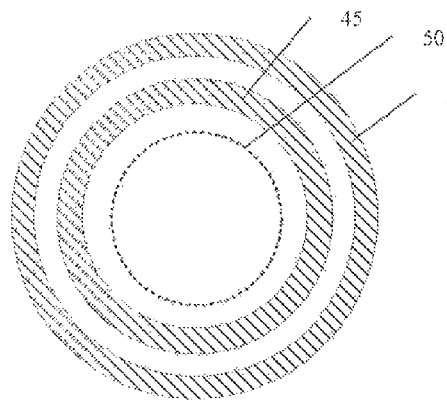
FIGS. 3(a)-3(e) shows different embodiments of patterns for the stress relief structures of these teachings.
Figure 3B:
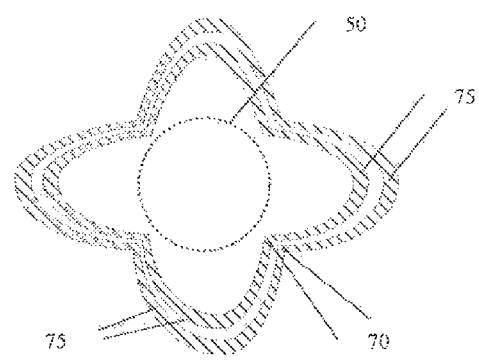
Figure 3C:
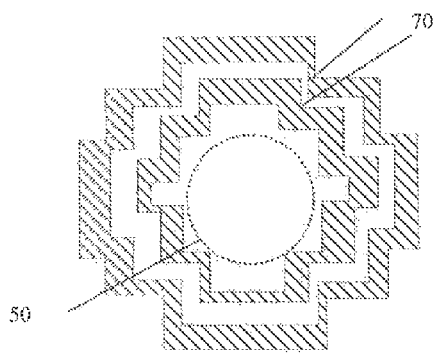
Figure 3D:
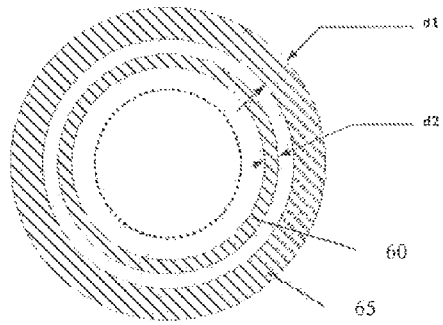
Figure 3E:
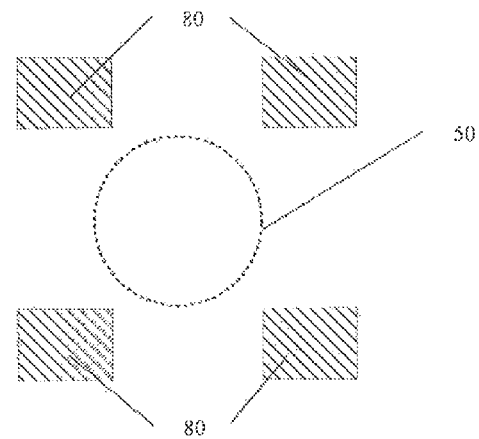

FIG. 2 shows a cross-sectional view of one embodiment of the system of these teachings. Referring to FIG. 2, in the embodiment shown therein, a sensor 15 has a first surface 30 and a second surface 35. The second surface 35 is disposed away from this surface 25 of the package component 20. A number of support members 40 extend from the second surface 35 of the sensor 15 to the surface 25 of the package component 20. The support members 40 are disposed and operatively connected to only a portion of the second surface 35. As a result of placing the support members between the package component 20 and the sensor 15, the area of contact between the sensor 15 and the package component 20 is reduced and the connection between the sensor 15 and the package component 20 is more flexible.

In the embodiment shown in FIG. 2, the material of the support members 40 is the same material as the material of a section of the sensor 15 proximate to the second surface 35. Proximate, as used herein, refers to next or nearest in space, which is the dictionary definition. It should be noted that other embodiments, including embodiments using other materials, are within the scope of these teachings.

FIGS. 3(a)-3(e) shows different embodiments of patterns for the support members used in these teachings. In the embodiments shown in FIGS. 3(a)-3(d), a first support member 45 surrounds a central region 50 of the second surface (35, FIG. 2) and each subsequent support member 55 surrounds prior support members. In the embodiments shown in FIGS. 3(a)-3(d), each support member is a closed structure. In the embodiments shown in FIGS. 3(a)-3(d), each support member includes a hollow cylindrical structure 45, 55, 70, 75, 60, 65. A cylinder, also referred to as a hollow cylindrical structure, as used here in, is a solid consisting of two parallel planes bounded by identical closed curves that are interconnected at every point by a set of parallel lines, usually perpendicular to the planes. In the embodiments shown in FIGS. 3(b)-3(c), closed curves in the hollow cylindrical structure are not circles. In the embodiments shown in FIGS. 3(b)-3(c), each one of the closed curves has a number of sections 75, each section 75 being joined to another section 75 at one or more intersection points 70. A slope of each section 75 is not equal to a slope of another section 75 at one or more of the intersection points 70. "Slope," as used herein, refers to the magnitude of the first derivative of the mathematical function defining or approximating the section, where the term "derivative" is used as defined in calculus. The slope of one section, at the intersection point, not being equal to the slope of another section, corresponds to the mathematical condition that the function is continuous but the derivative is not continuous. In the embodiment shown in FIG. 3(d), a width, $d_2$, of one support member 60 is smaller than the width, $d_1$, of other support members 65. In the embodiments of FIGS. 3(a)-3(d), where the support members are closed structures and where there are two or more support members, a sealing or bonding material can be applied to one or more support members while one or more other support members are able to move along the surface 25 of the package component 20. That configuration enables a hermetic seal between the sensor 15 and the package component 20 while retaining flexibility in the structure. In the embodiment shown in FIG. 3(e), the support members 80 surround the central region 50 of the second surface but are not closed structures.

FIG. 4 shows a cross-sectional view of another embodiment of the system of these teachings. Referring to FIG. 4, in the embodiment shown therein, a soft material 85 is disposed between the second surface 35, the package surface 25 and the support members 40. A "soft material," as used herein, is a material having Young's modulus that is at least 5 times smaller than a Young's modulus of the second surface material or a Young's modulus of the package surface. The soft material can be used to alter the stiffness of the structure.

FIG. 5 shows a cross-sectional view of yet another embodiment of the system of these teachings. Referring to FIG. 5, in the embodiment shown therein, the support members include a first number of support members 90 extending away from the second surface 35 and a second number of support members 95 extending from the package surface 25 to the second surface 35, the second number of support members 95 are configured to receive the first number of support members 90. In the embodiment shown in FIG. 5, each support member from the first number of support members 90 extends a distance away from the second surface 35, the distance being smaller than a distance between the second surface 35 and the package surface 25. Also in the embodiment shown in FIG. 5, a soft material 85 is disposed between the second surface 35, the package surface 25 and the first and second number of support members 90, 95. It should be noted that the soft material can be applied onto the first number of support members 90 before the system is assembled or onto the second number of support members 95 before the system is assembled. (The soft material can be applied by any conventional techniques suitable for soft materials. Conventional deposition techniques may be suitable for some materials. For other soft materials, layer by layer deposition techniques, spray techniques, pulsed laser evaporation, matrix assisted pulsed laser operation, and direct topical application can be used to apply the material.) Embodiments in which the soft material is disposed on the second surface 35, the package surface 25 and the second number of support members 95 and embodiments in which the soft material is disposed on the second surface 35, the package surface 25 and the first number of support members 90 are also within the scope of these teachings. The embodiment shown in FIG. 5 enables a configuration in which to control stiffness of the structure by placing the soft material between the first and second number of support members 90, 95. It should be noted that embodiments in which a soft material is not used are also within the scope of these teachings.

Embodiments of support members such as those shown in FIGS. 3(a)-3(d), in which each support member includes a hollow cylindrical structure, can be used in embodiments of the system in which a sealing material is applied between the package surface and at least one support member. The sealing material provides a hermetic seal between the package surface and at least one support member. Sealing material is applied using conventional techniques such as, but not limited to, topical application of an adhesive or a sealing compound. Embodiments of support members such as those shown in FIGS. 3(a)-3(d) can also be used in embodiments of the system in which at least one support member is bonded, using conventional bonding techniques, to the second surface (25, FIG. 2) in order to provide a hermetic seal. In some embodiments, the support member surrounding and closest to the central region of the second surface is sealed or bonded to the second surface. It should be noted that other embodiments, in which other support members are sealed or bonded to the second surface are also within the scope of these teachings.

Figure 6:
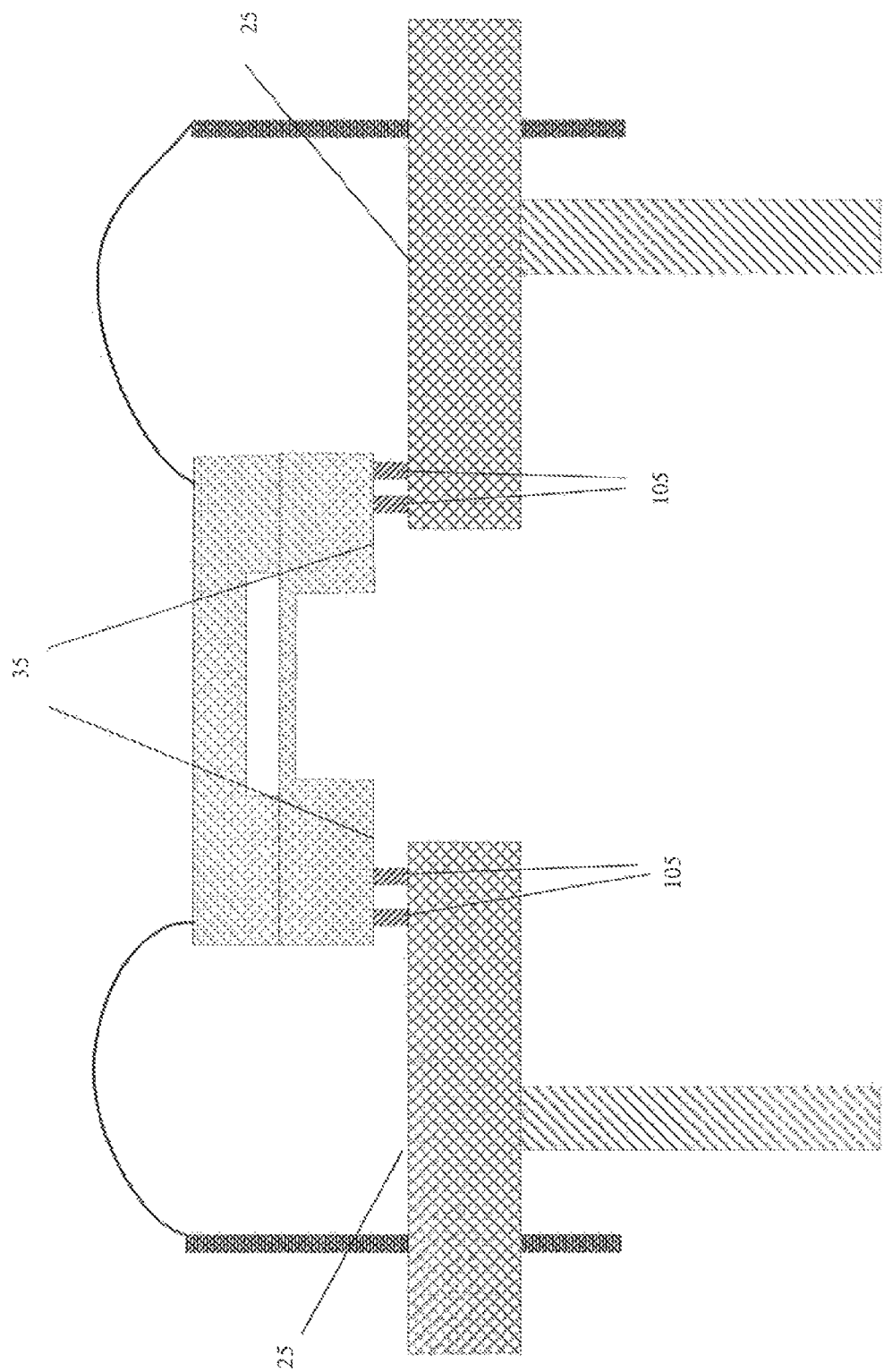
FIG. 6 is a cross-sectional view of a further embodiment of the stress relief structure of these teachings.

FIG. 6 is a cross-sectional view of a further embodiment of the system of these teachings. Referring to FIG. 6, in the embodiment shown therein, the support members 105 are comprised of the same material as a material of the package surface 25. It should be noted that embodiments in which other materials are used for the support members 105 are also within the scope of these teachings.

Figure 7A:
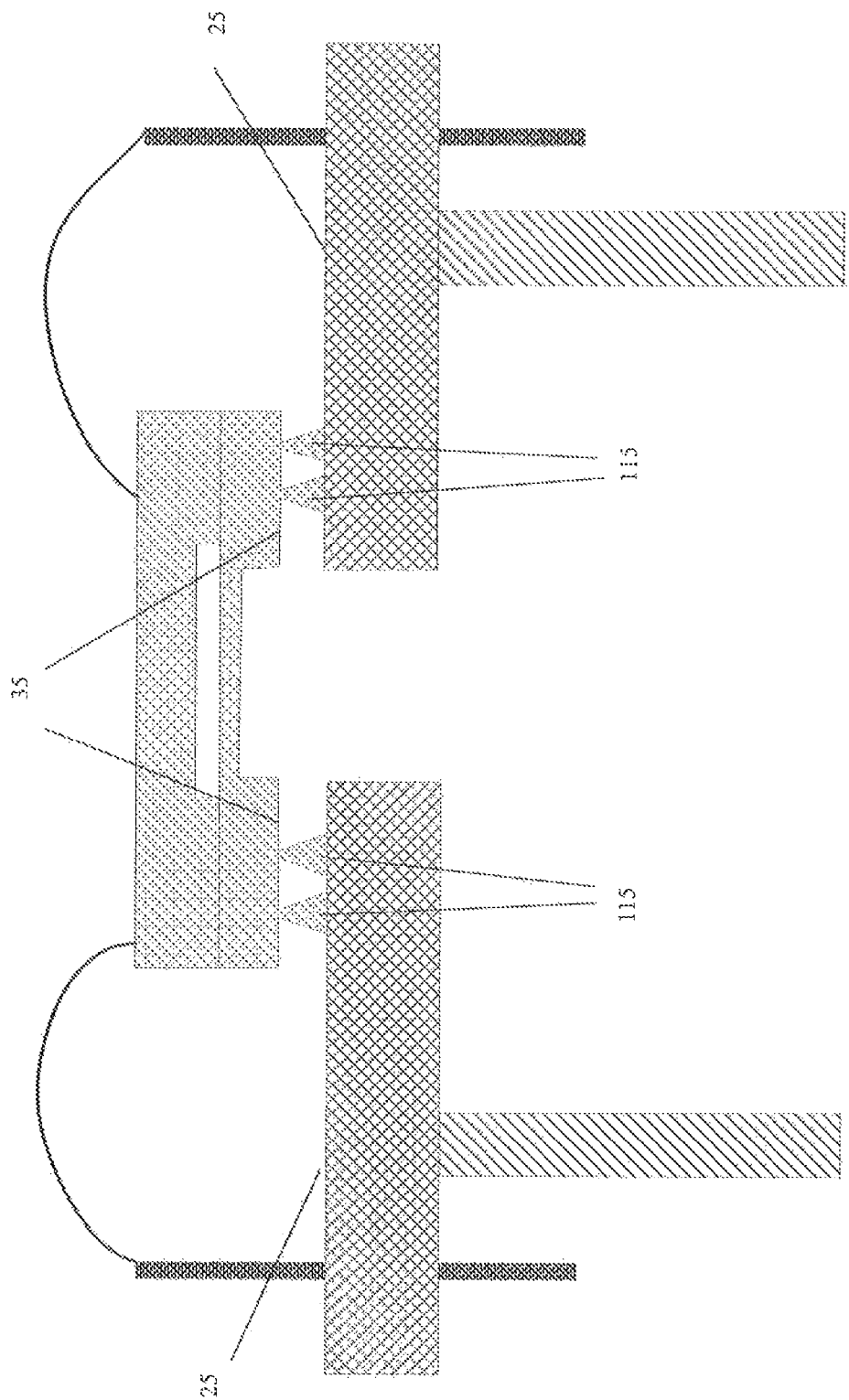
FIGS. 7a, 7b represent cross-sectional views of still another embodiment of the stress relief structure of these teachings.
Figure 7B:
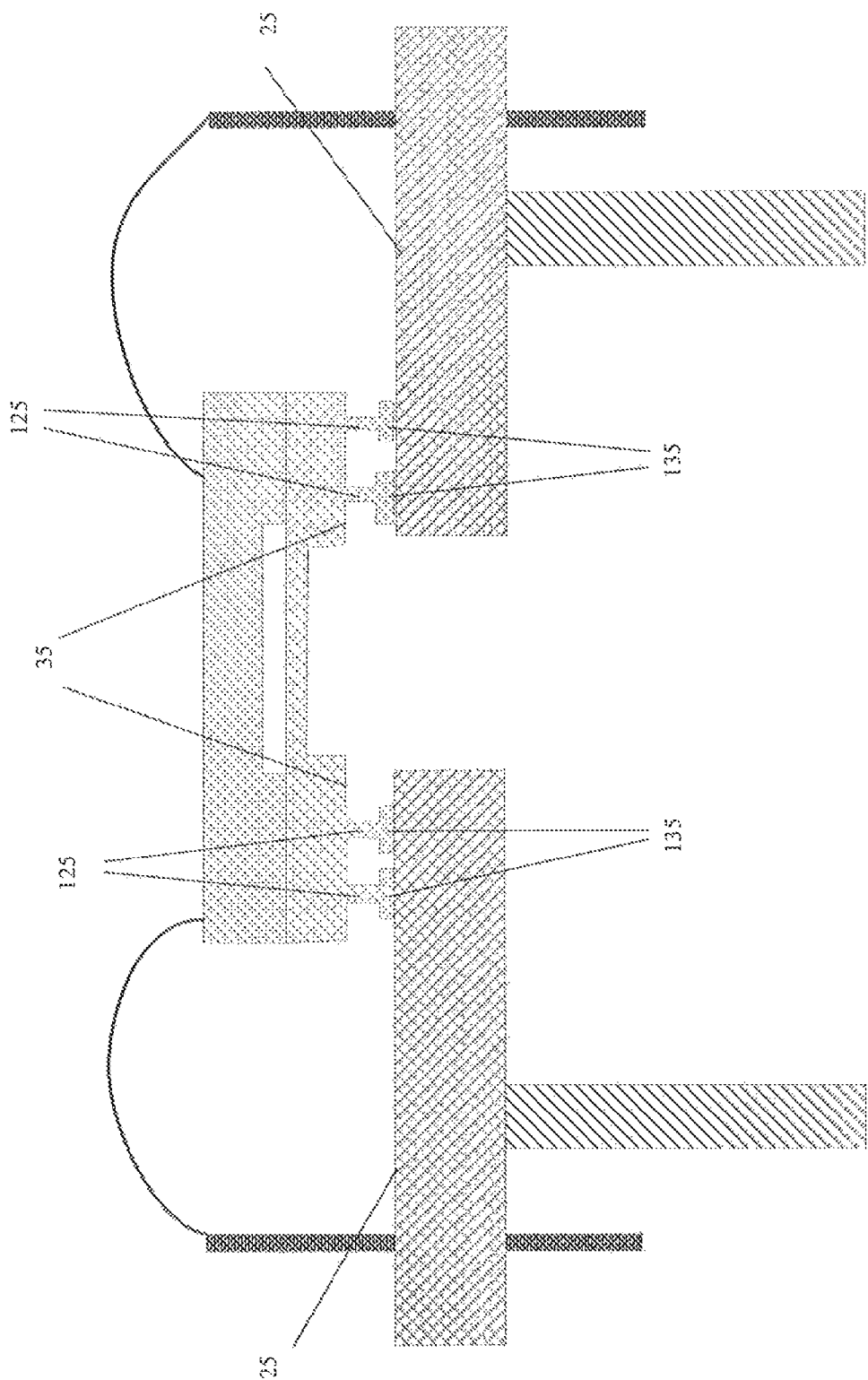

FIGS. 7a, 7b represent cross-sectional views of still another embodiment of the stress relief package of these teachings. Referring to FIG. 7a, in the embodiment shown therein, each support member 115 has a cross-sectional area that varies with distance away from the second surface 35. Cross-sectional area of a support member or of component of a support member, as used herein, refers to a cross-sectional area substantially perpendicular to a centerline of each support member, the centerline extending from the second surface 35 towards the package surface 25. In the embodiment shown in FIG. 7a, the cross-sectional area of each support member 115 increases with distance, the distance being measured from the second surface towards the package surface (hereinafter referred to as distance away from the second surface) but it should be noted that embodiments in which the cross-sectional area of each support member decreases with distance away from the second surface 35 are also within the scope of these teachings.

Referring to FIG. 7b, in the embodiment shown therein, each support member has two subcomponents; a first subcomponent 125 extending from the second surface 35 to a predetermined location between the second surface 35 and the package surface 25 and a second subcomponent 135 extending from the predetermined location to the package surface. In the embodiment shown in FIG. 7b, a cross-sectional area of the first subcomponent 125 being smaller than a cross-sectional area of the second subcomponent 135. Embodiments in which the cross-sectional area of the first subcomponent is larger than the cross-sectional area of the second subcomponent are also within the scope of these teachings. Embodiments such as those shown in FIGS. 7a, 7b enable affecting the propagation of stresses from the package component 20 (FIG. 2) to the sensor 15 (FIG. 2). In the instance where the stresses are thermal stresses, embodiments such as those shown in FIGS. 7a, 7b enable affecting the thermal resistance and thermal conductance.

Referring to FIGS. 7a and 7b, in the embodiment shown there in, the support members comprise the same material as the material of the sensor. It should be noted that embodiments in which the support members comprise different materials from the material of the sensor also within the scope of these teachings.

In one or more embodiments, the method of these teachings for fabricating a sensor system having reduced stress due to package-sensor interaction includes etching into a surface of a component of a sensor structure, the sensor structure also having a first surface, in order to form a second surface of the sensor structure and one or more support structures disposed on the second surface. The second surface is disposed away from the first surface. The second surface is also disposed away from a package surface and located between the first surface and the package surface. The support members are configured to reduce stress produced by package-sensor interaction. In this embodiment, the surface of the component that provides the second surface of the sensor is etched to produce multiple continuous changes and support members. In several embodiments, the support structures described hereinabove corresponding to FIGS. 2, 3(a)-3(e), and 5 are produced by etching.

In order to elucidate the above embodiment of the method of these teachings, an exemplary embodiment is presented herein below. FIG. 8 shows an exemplary sensor structure 17, which, after processing, provides the sensor 15 and support structures 40 of FIG. 2. Referring to FIG. 8, in the embodiment shown there in, the sensor structure 17 has a first surface 25, an inner surface 36 and a section 37 disposed away from the inner surface 36. Etching into the surface 39 of the section 37, the second surface 35 and the support structures 40 (FIG. 2) are formed.

In one instance, the section 37, that provides the second surface of the sensor structure, is comprised of silicon.

In one instance, the method of these teachings also includes trimming each support member such that each support member has a cross-sectional area that varies with distance away from the second surface. In one embodiment, the cross-sectional area increases with distance away from the second surface. In another embodiment, the cross-sectional area decreases with distance away from the second surface.

In another instance, the method of these teachings also includes trimming each support member such that each support member comprises two subcomponents. The two subcomponents include a first subcomponent extending from the second surface to a predetermined location between the second surface and the package surface and a second subcomponent extending from the predetermined location to the package surface. In one embodiment, a cross-sectional area of the first subcomponent is smaller than a cross-sectional area of the second subcomponent. Embodiments in which the cross-sectional area of the first subcomponent is larger than the cross-sectional area of the second subcomponent are also within the scope of these teachings.

There are a number of advantages of the present teachings over conventional systems and methods. One of those advantages is that, in the systems of the present teachings, the bonding or contact area with the package surface is reduced and the stresses are localized to isolated positions. The configuration of the present teachings suppresses stress during the packaging process. The embodiments having multiple closed support structures enable improving the package hermeticity by enabling substantially sealing soldering or sealing the space between one or more of the support structures and the package surface (in one instance, removing air bubbles from the contact area). Substantially sealing the space can be accomplished by applying sealing material or soldering material to the support structure faces.

Figure 9:
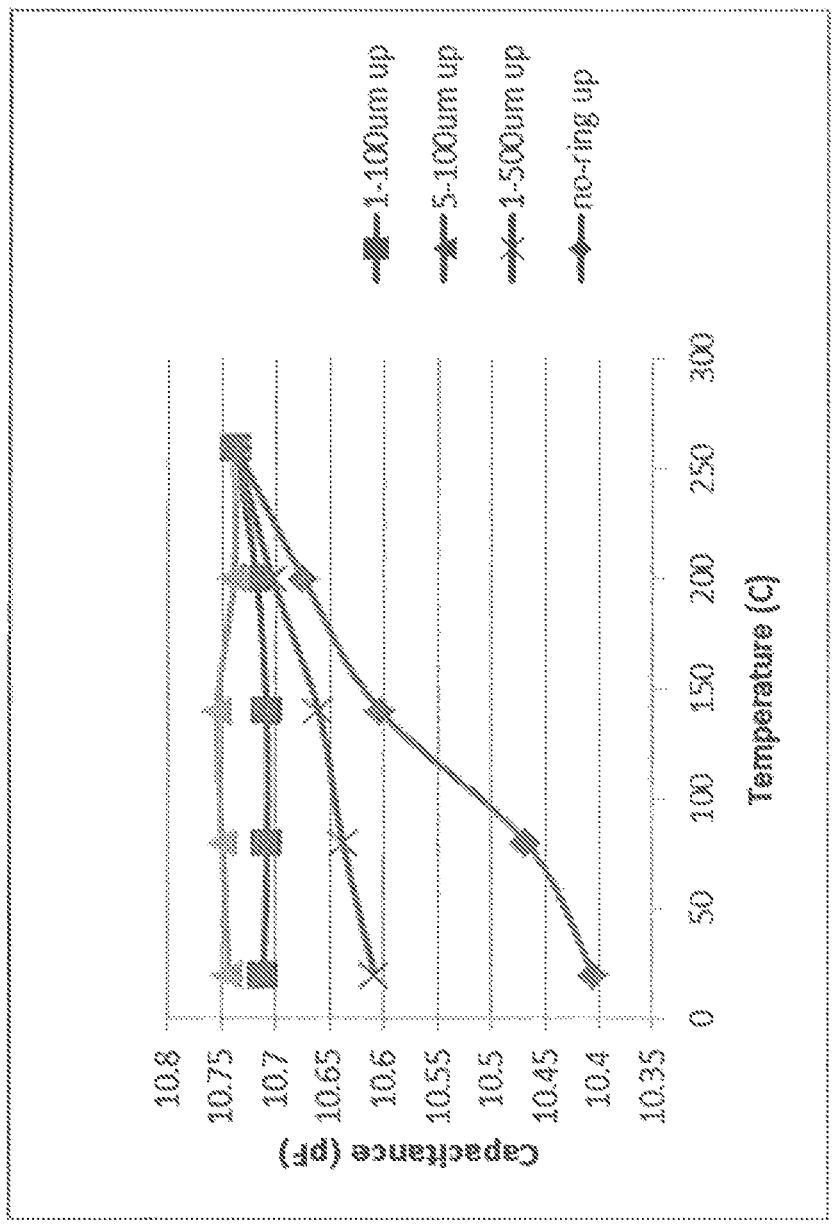
FIG. 9 shows simulation results for some embodiments of these teachings and for a conventional embodiment.

FIG. 9 shows simulation results for some embodiments of these teachings and for a conventional embodiment. Referring to FIG. 9, in the results shown there in, "no-ring up" indicates conventional flat to flat surface bonding. "1-500 μm up" indicates a single silicon ring shaped support member, as in FIG. 2, the single silicon ring shaped support member having a 500 μm width (width being d1 or d2 in FIG. 3(d)). Referring again to FIG. 9, "5-100 μm up" indicates five 100 μm wide silicon ring shaped supports as in FIG. 2. Referring again to FIG. 9, "1-100 μm" indicates a single 100 μm wide silicon ring shaped support member, as in FIG. 2. As can be seen from FIG. 9, reduced contact area or with multiple subcomponents, as obtained in the present teachings, reduces the performance drift (e.g. capacitance drift of a capacitive pressure sensor) from temperature changes.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although the invention has been described with respect to various embodiments, it should be realized these teachings are also capable of a wide variety of further and other embodiments within the spirit and scope of the appended claims.

What is claimed is:

1. A system comprising:
   a sensor having a first surface and a second surface, the second surface being disposed away from the first surface; the second surface also being disposed away from a package surface and located between the first surface and the package surface; and one or more support members, each support member from the one or more support members extending from the second surface to the package surface, the one or more support members being disposed on and operatively connected to only a portion of the second surface, the one or more support members being configured to reduce stress produced by package-sensor interaction; wherein a first support member from the one or more support members surrounds a central region of the second surface, and a second support member from the one or more support members surrounds the first support member.

2. The system of claim 1 wherein each support member from the one or more support members comprises a closed structure.

3. The system of claim 2 wherein each support member from the one or more support members comprises a hollow cylindrical structure.

4. The system of claim 1 wherein each support member from the one or more support members is comprised of the same material as a section of the sensor proximate to the second surface.

5. The system of claim 1 further comprising a soft material disposed between the second surface, the package surface and the one or more support members.

6. The system of claim 1 wherein each support member from the one or more support members is comprised of the same material as the package surface.

7. The system of claim 1 wherein the one or more support members comprises:

one or more first support members extending away from the second surface; and one or more second support members extending from the package surface to the second surface;

the one or more second support members configured to receive the one or more first support members.

8. The system of claim 7 wherein each support member from the one or more first support members extends a distance away from the second surface, said distance being smaller than a distance between the second surface and the package surface.

9. The system of claim 7 further comprising a soft material disposed between the second surface, the package surface and the one or more second support members.

10. The system of claim 7 further comprising a soft material disposed between the second surface, the package surface and the one or more first and one or more second support members.

11. The system of claim 1 wherein the one or more support members comprise at least two support members.

12. The system of claim 11 wherein a width of one support member is smaller than a width of other support members.

13. The system of claim 11 wherein a sealing material is applied between the package surface and at least one support member; the sealing material being configured to provide a hermetic seal.

14. The system of claim 11 wherein at least one support member is bonded to the package surface.

15. The system of claim 1 wherein each support member from the one or more support members has a cross-sectional area that varies with distance away from the second surface; the cross-sectional area increasing with distance away from the second surface.

16. The system of claim 1 wherein each support member from the one or more support members comprises two subcomponents: a first subcomponent extending from the second surface to a predetermined location between the second surface and the package surface and a second subcomponent extending from said predetermined location to the package surface; a cross-sectional area of the first subcomponent being smaller than a cross-sectional area of the second subcomponent.

17. The system of claim 3 wherein closed curves in the cylindrical structure are not circles.

18. The system of claim 17 wherein each one of the closed curves comprises a plurality of sections, each section from the plurality of sections being joined to another section from the plurality of sections at one or more points; a slope of said each section not being equal to a slope of said another section at at least one of said one or more points.

19. The system of claim 1 wherein each support member from the one or more support members has a cross-sectional area that varies with distance away from the second surface; the cross-sectional area decreasing with distance away from the second surface.

20. The system of claim 1 wherein each support member from the one or more support members comprises two subcomponents; a first subcomponent extending from the second surface to a predetermined location between the second surface and the package surface and a second subcomponent extending from said predetermined location to the package surface; a cross-sectional area of the first subcomponent being larger than a cross-sectional area of the second subcomponent.

\* \* \* \* \*